(12) United States Patent
Ham et al.

(10) Patent No.: US 7,061,240 B2
(45) Date of Patent: Jun. 13, 2006

(54) MAGNETIC RESONANCE IMAGING METHOD WITH REDUCED ACOUSTIC NOISE

(75) Inventors: Cornelis Leonardus Gerardus Ham, Eindhoven (NL); Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 41 days.

(21) Appl. No.: 10/496,489

(22) PCT Filed: Nov. 20, 2002

(86) PCT No.: PCT/IB02/04871

§ 371 (c)(1), (2), (4) Date: May 24, 2004

(87) PCT Pub. No.: WO03/046597

PCT Pub. Date: Jun. 5, 2003

(65) Prior Publication Data

US 2004/0245987 A1    Dec. 9, 2004

(30) Foreign Application Priority Data

Nov. 26, 2001  (EP) ................................. 01204540

(51) Int. Cl.
*G01V 3/00* (2006.01)
(52) U.S. Cl. ..................................... 324/309
(58) Field of Classification Search ................ 324/307, 324/309; 600/410
See application file for complete search history.

(56) References Cited

U.S. PATENT DOCUMENTS

| 4,680,545 A | 7/1987 | Gray et al. |
| 4,866,260 A * | 9/1989 | Lescourret ............... 324/76.28 |
| 4,949,040 A * | 8/1990 | Proksa ........................ 324/307 |
| 6,198,282 B1 | 3/2001 | Dumoulin .................... 324/307 |

(Continued)

FOREIGN PATENT DOCUMENTS

WO    WO 98/21600    5/1998

(Continued)

OTHER PUBLICATIONS

Intera Application Guide, Release 8, vol. 2: Scan Methods; 2001; Philips Medical Systems; Nederland B.V.; Netherlands, pp. 5-8.

*Primary Examiner*—Diego Gutierrez
*Assistant Examiner*—Dixomara Vargas
(74) *Attorney, Agent, or Firm*—Thomas M. Lundin

(57) ABSTRACT

A magnetic resonance imaging method comprises application of a pulse sequence which includes one or more pulses. The pulse sequence having an intrinsic scan time based on a full sampling rate in k-space for a predetermined full 'field-of-view' and a reference temporal pulse shape of the magnetic gradient pulses. A series of magnetic resonance signals is acquired by means of a receiver antennae system having a spatial sensitivity profile. Undersampled signal acquisition is applied to acquire undersampled magnetic resonance signals at a predetermined reduced sampling rate in k-space, the sampling rate being reduced by a reduction factor relative the full sampling rate. The pulse sequence being is during an actual signal scan time is applied. The actual signal scan time being larger than the intrinsic signal scan time times the reduction factor. The undersampling allows a smaller acquisition rate of the magnetic resonance signals and smaller slew rates and amplitudes of the magnetic gradient pulses and lower peak RF-fields of the refocusing pulses. Hence, lower acoustic noise and lower specific absorption rate are achieved.

5 Claims, 3 Drawing Sheets

U.S. PATENT DOCUMENTS

Figure 1:
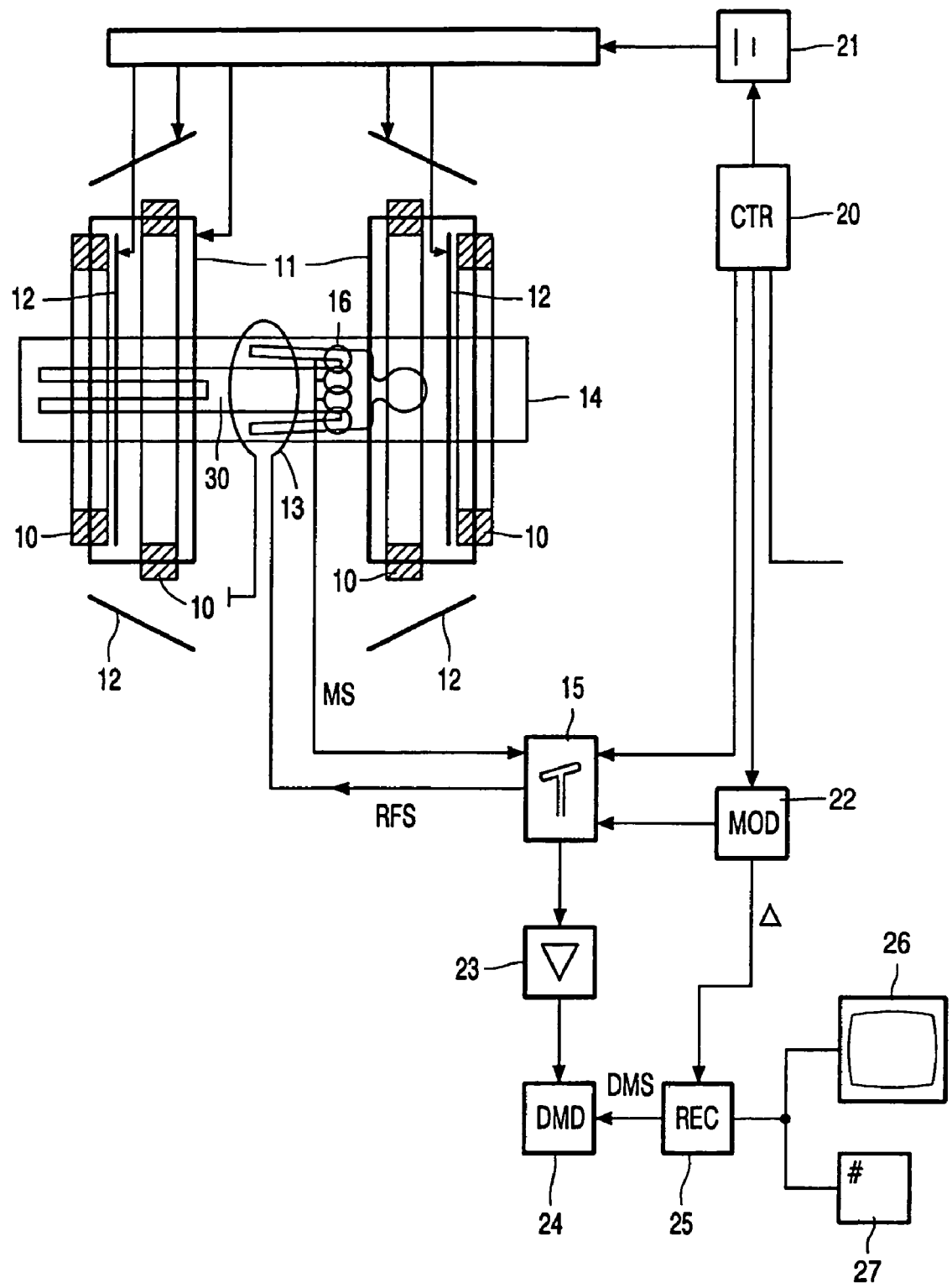

2001/0010464 A1    8/2001  Takamori et al. ........... 324/304
2003/0032877 A1*   2/2003  Watts et al. ................ 600/410
2005/0020897 A1*   1/2005  Fuderer ...................... 600/407

FOREIGN PATENT DOCUMENTS

WO     WO 99/54746     10/1999

\* cited by examiner

MAGNETIC RESONANCE IMAGING METHOD WITH REDUCED ACOUSTIC NOISE

The invention relates to a magnetic resonance imaging method comprising application of a pulse sequence which includes one or more pules.

Such a magnetic resonance imaging method is known from the US-patent U.S. Pat. No. 4,680,545.

In general, magnetic resonance imaging methods involve pulse sequences which include radio-frequent (RF) pulses and magnetic gradient pulses. RF-pulses are for example used as excitation pulses and as refocusing pulses. Magnetic gradient pulses are notably used for spatial encoding of the magnetic resonance signals. Both RF-pulses and magnetic gradient pulses can be applied to manipulate the phase of the magnetic resonance signals.

The switching on and off of the magnetic gradient pulses causes acoustic vibrations of gradient coils by which the magnetic gradients are applied. If no steps are taken, the acoustic vibrations of the gradient coils may cause annoying sounds such as noise, clicks and humming.

The known magnetic resonance imaging method employs magnetic gradient pulses with a reduced slew rate and sinusoidally shaped pulse edges. Although the known magnetic resonance imaging method reduces the acoustic noise due to the gradient pulses, the reduced slew rate and sinusoidally shaped pulse edges cause to increase the scan time, i.e. the time required to acquire all magnetic resonance signals needed for reconstruction of the magnetic resonance image. Consequently, the known magnetic resonance imaging method is not suitable to produce successive magnetic resonance images at a high rate.

An object of the invention is to provide a magnetic resonance imaging method which does not produce annoyingly loud noise and in which of the scan time is reduced.

This object is achieved by a magnetic resonance imaging method according to the invention involving acquisition of a series of magnetic resonance signals by means of a receiver antennae system having a spatial sensitivity profile, wherein undersampled signal acquisition is applied to acquire undersampled magnetic resonance signals at a predetermined reduced sampling rate in k-space, the sampling rate being reduced by a reduction factor relative the full sampling rate the pulse sequence being applied during an actual signal scan time, the actual signal scan time being larger than the intrinsic signal scan time times the reduction factor.

In order to allow comparison, a reference temporal pulse shape of the pulses is introduced. Preferably a commonly used temporal pulse shape, such as a trapezoidal temporal pulse shape may be used as the reference temporal pulse shape for the magnetic gradient pulses, but any predetermined temporal pulse shape can be employed as the reference temporal pulse shape. For the RF-pulses, notably the RF-excitation pulses and the refocusing RF-pulses, a reference pulses shape is represented for example by its temporal pulse duration, peak RF-field amplitude and the flip angle over which spins are flipped by the RF-pulse at issue. It is noted that the flip angle depends on temporal pulse duration and peak RF-amplitude.

Further, the reference temporal pulse shape may involve different or the same pulse shapes for respective individual magnetic gradient pulses and/or RF-pulses in the pulse sequence.

According to the invention, the magnetic resonance signals are acquired at a sampling rate in k-space that is less than required for the predetermined full 'field-of-view'. As a consequence of the reduced sampling rate, these undersampled magnetic resonance signals only have a partial spatial encoding in that individual undersampled magnetic resonance signals include contributions from different spatial positions within the predetermined full 'field-of-view'. Signal contributions relating to separate spatial positions are computed from the undersampled magnetic resonance signals on the basis of the spatial sensitivity profile of the receiver antennae system. In other words, the spatial sensitivity profile of the receiver antennae system provides the additional spatial encoding that is not present in the undersampled magnetic resonance signals. A magnetic resonance image is reconstructed from the undersampled magnetic resonance signals and with the use of the spatial sensitivity profile of the receiver antennae system.

The undersampling allows the acquisition of less undersampled magnetic resonance signals than the full sampling would require. According to the magnetic resonance imaging method according to the invention, the scan time of the pulse sequence is less reduced, or not reduced at all, than the reduction of the sampling rate in k-space would allow for acquisition of the same number of magnetic resonance signals. Hence, the invention allows the magnetic resonance signals to be acquired at a lower temporal rate and consequently the temporal variations of the magnetic gradient pulses in the pulse sequence are more slowly than the reference temporal pulse shape. In order to make a fair comparison, the intrinsic signal scan time is defined for a pulse sequence that only differs from the actually employed pulse sequence as to the temporal reference pulse shape of the magnetic gradient pulses and of the RF-pulses. That is, the intrinsic signal scan time is computed for a pulse sequence having the same succession of magnetic gradient pulses and RF-pulses as the actual pulse sequence, but wherein the magnetic gradient pulses have the reference temporal pulse shape(s). Thus, less acoustic noise is generated, while the scan time is equal to or still less than the intrinsic scan time that is involved if the magnetic gradient pulses with the reference pulse shaped are employed. Notably, the acoustic noise is less as the actual signal scan time is reduced less than what the reduction of the sampling rate in k-space allows. In particular, the invention allows to obtain an optimum compromise between reduction of the actual signal scan time and reduction of acoustic noise for different circumstances. For example, when the gradient slopes rise to 10 $mTm^{-1}$ in 1–3 ms are employed, as compared to a gradient slope of 21 $mTm^{-1}$ in 0.2 ms for the reference pulse shape, the acoustic noise is reduced by about 20–30 dB.

Moreover, the undersampling allows to use a lower gradient amplitude, using a lower receiver bandwidth owing to the correspondingly longer signal scan time. This will increase the signal-to-noise ratio of the magnetic resonance signals.

The degree of undersampling is given by the reduction factor which is defined as the ratio of the actual sampling rate or density in k-space relative to the full sampling rate. Thus, if e.g. only half of the magnetic resonance signals required for full sampling is actually sampled, the reduction factor is ½. More generally, the reduction factor is a rational number in the interval [0,1].

In addition of the reduction of the acoustic noise, also reduction of the electromagnetic energy deposited by the pulse sequence in the patient's tissue is reduced. This deposition of electromagnetic energy is represented by the quantity usually denoted 'specific absorption rate'. The specific absorption rate (or SAR) is defined as the radio frequency power absorbed per unit of mass of an object. In particular, the specific absorption rate is reduced owing to reduction of the slew rate of the magnetic gradient pulses. Also lower peak RF-fields of the RF-pulses reduce the specific absorption rate. Since, the scan time is less reduced than the degree of undersampling of the magnetic resonance signals would allow, the temporal duration of the RF-pulses can be increased so as to achieve the desired flip angle while employing a lower peak RF-field without the need the increase the scan time relative to the reference pulse sequence. The reduction of the specific absorption rate achieved by the magnetic resonance imaging method according to the invention causes less inadvertent heating of the patient's local body temperature. Hence, physiological uncomfortable or even detrimental effects caused by increase of the patient's body temperature are mitigated or even avoided. The lower specific absorption rate in combination with the possibility to employ relatively short scan time is especially more advantageous as stronger static magnetic fields are employed, such as in a field strength region above 1.5 T, especially in magnetic fields of above 3 T. In addition, reduction of the slew rate and/or of the gradient amplitude of the magnetic gradient pulses results in lowering of peripheral nerve stimulation in the patient to be examined.

These and other aspects of the invention will be further elaborated with reference to the embodiments defined in the dependent Claims.

A particular effective reduction of acoustic noise and/or specific absorption rate is achieved when the actual signal scan time is equal or about equal to the intrinsic signal scan time. In this implementation the reduction of the number of magnetic resonance signals acquired is entirely used to reduce the signal acquisition rate and consequently to reduce the temporal variations of the magnetic gradient pulses and/or to reduce the number and peak RF-field of the refocusing RF-pulses. Nevertheless, the actual signal scan time does not yet exceed the intrinsic signal scan time.

In particular, effective noise reduction is achieved by employing magnetic gradient pulses having temporal variations that are more slowly than the reference temporal variations. Although the time involved to apply the magnetic gradient pulses is longer, the time required to acquire the magnetic resonance signals is not increased because less magnetic resonance signals are acquired owing to the undersampling.

For example, noise reduction is achieved by employing a slew rate of the magnetic gradient pulses that is lower than the slew rate in the reference temporal pulse shape. As the slew rate is one of the dominant sources of acoustic vibrations, decreasing the slew rate leads to a substantial reduction of acoustic noise.

The number of acquired magnetic resonance (MR) signals for an individual magnetic resonance image is reduced by employing undersampling of the MR-signals. Such undersampling involves a reduction in k-space of the number of sampled points which can be achieved in various ways. Many magnetic resonance imaging methods which involve undersampling have been proposed. Often these magnetic resonance imaging methods are termed 'parallel imaging methods', because the undersampled magnetic resonance signals relate to several lines in k-space simultaneously, so that in fact two or more lines in k-space are acquired in parallel. Notably, the MR signals are picked-up through signal channels pertaining to several receiver antennae, such as receiver coils, preferably surface coils. Acquisition through several signal channels enables parallel acquisition of signals so as to further reduce the signal scan time.

Owing to the undersampling, sampled data contain contributions from several positions in the object being imaged. The magnetic resonance image is reconstructed from the undersampled MR-signals with the use of a sensitivity profile associated with the signal channels. Notably, the sensitivity profile is for example the spatial sensitivity profile of the receiver antennae, such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, i.e. the smallest wavenumber, involved, is the field-of-view (FOV) of the magnetic resonance image. The resolution is determined by the ratio of the field-of-view and the number of samples.

The undersampling may be achieved in that respective receiver antennae acquire MR signals such that their resolution in k-space is coarser than required for the resolution of the magnetic resonance image. The smallest wavenumber sampled, i.e. the minimum step-size in k-space, is increased while the largest wavenumber sampled is maintained. Hence, the image resolution remains the same when applying undersampling, while the minimum k-space step increases, i.e. the FOV decreases. The undersampling may be achieved by reduction of the sample density in k-space, for instance by skipping lines in the scanning of k-space so that lines in k-space are scanned which are more widely separated than required for the resolution of the magnetic resonance image. The undersampling may be achieved by reducing the field-of-view while maintaining the largest k-value so that the number of sampled points is accordingly reduced. Owing to the reduced field-of-view sampled data contain contributions from several positions in the object being imaged.

Notably, when receiver coil images are reconstructed from undersampled MR-signals from respective receiver coils, such receiver coil images contain aliasing artefacts caused by the reduced field-of-view. From the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in the international application no. WO 99/54746-A1.

Alternatively, the undersampled MR-signals may be combined into combined MR-signals which provide sampling of k-space corresponding to the full field-of-view. In particular, according to the so-called SMASH-method undersampled MR-signals approximate low-order spherical harmonics which are combined according to the sensitivity profiles. The SMASH-method is known as such from the international application no. WO 98/21600.

Undersampling may also be carried-out spatially. In that case the spatial resolution of the MR-signals is less than the resolution of the magnetic resonance image and MR-signals corresponding to a full resolution of the magnetic resonance image are formed on the basis of the sensitivity profile. Spatial undersampling is in particular achieved in that MR-signals in separate signal channels, e.g. from individual receiver coils, form a combination of contributions from several portions of the object. Such portions are for example simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

Advantageously, in the pulse sequence of the magnetic resonance imaging method according to the invention the pulse shape(s) of the magnetic gradient pulses is adjustable. Thus it is achieved that the signal scan time can be reduced at the cost of a higher acoustic noise level and/or specific absorption rate. In some examination circumstances, having a short signal scan time is more worthwhile than lowering the acoustic noise level and/or specific absorption rate. Particular examples are magnetic resonance imaging methods which involve scanning within a patient's breathhold, magnetic resonance imaging methods aimed at imaging perfusion in the patient's brain and in general magnetic resonance imaging methods driven by temporal physiological processes in the patient to be examined. The adjustable actual signal scan time renders the magnetic resonance imaging method according to the invention more flexible than the conventional magnetic resonance imaging method.

These and other aspects of the invention will be elucidated with reference to the embodiments described hereinafter and with reference to the accompanying drawing wherein FIG. 1 shows diagrammatically a magnetic resonance imaging system in which the invention is used and FIGS. 2 to 5 show simple examples of comparison of the actual signal scan time to the intrinsic scan time.

FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. the gradient coils 11, 12 are energized by application of an electric current by means of the power supply unit 21. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Preferably, a so-called synergy coil is employed as the body coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that preferably separate receiving coils 16 are employed. In particular, surface coils 16 can be used as receiving coils. Such surface coils have a high sensitivity in a comparatively small volume. The spatial sensitivity profiles of the surface coils are preferably calibrated relative to the uniform sensitivity profile of the body coil.

The transmission coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF excitations and the application of the temporary gradient fields. In particular, according to the invention, the control unit is arranged to adjust the pulse shapes of the magnetic gradient pulses, such as the read gradient pulses and the phase-encoding gradient pulses. The control unit is arranged to receive a command from the user to set up the pulse sequence such that acoustic noise reduction is achieved. Upon this command, the control unit sets up the pulse sequence such that undersampled scanning of k-space is applied and e.g. the SENSE technique is applied for the reconstruction of the magnetic resonance image. Further, the pulse shapes are adjusted such that the signal scan time of the pulse sequence is about equal to the intrinsic signal scan time. To this end, the computer program according to the invention is loaded, for example, into the control unit 20 and the reconstruction unit 25.

Figure 2:
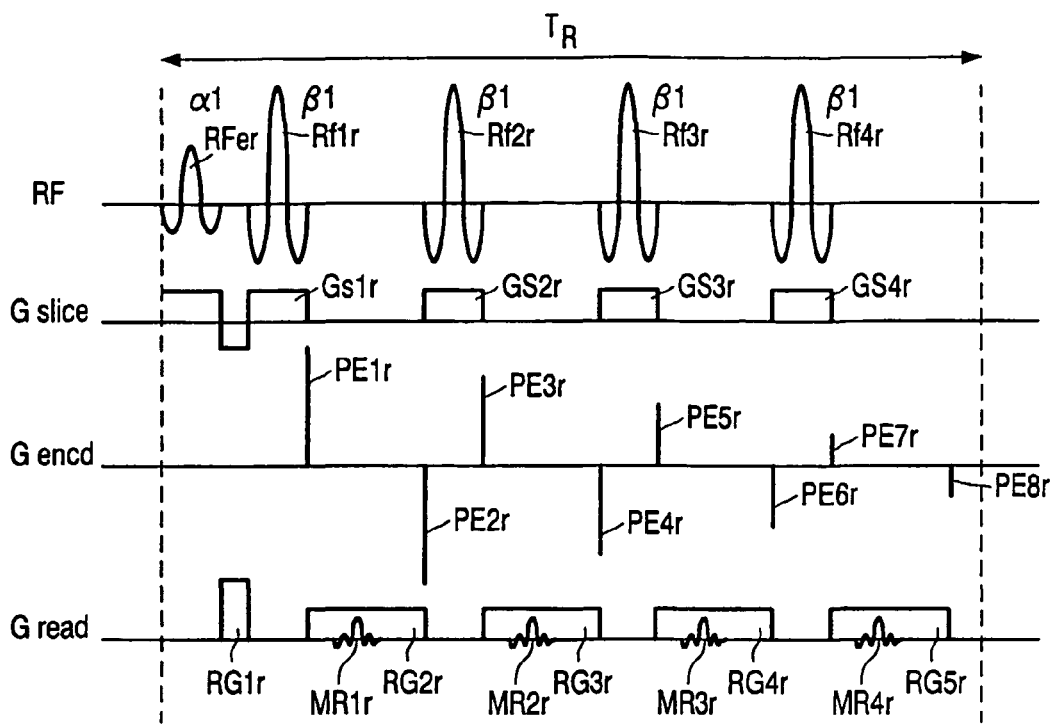

FIGS. 2 to 5 show a simple examples of comparison of the actual signal scan time to the intrinsic scan time. The exemplary pulse sequences shown graphically and by way of example in FIGS. 2 to 5 are TSE sequences. FIG. 2 represents the reference TSE pulse sequence for this example. Graph indicated '$G_{read}$' in FIG. 2 indicates the read gradient pulses in the read direction and also the magnetic resonance signals are represented. Graph $G_{slice}$ indicates the slice magnetic selection gradient pulses. $G_{enc}$ indicates the magnetic phase-encoding gradient pulses. Graph RF indicates the RF-pulses, such as radio-frequent excitation and refocusing pulses. The pulse sequence starts with an excitation RF-pulse (RFer, $\alpha_1$), e.g. a 90°-pulse to excite magnetic spins in the object to be examined. The RF-excitation pulse (RFer) acts slice selectively through a magnetic slice selection gradient pulse (Gs1r) that is applied simultaneously with the RF-excitation pulse (RFer). Subsequently, successive RF refocusing pulses (Rf1r, Rf2r, ... Rf4r) ($\beta_1$) are applied to refocusing the transverse magnetization component are applied to generate spin-echo magnetic resonance signals. Owing to these RF refocusing pulses, a succession of spin echo magnetic resonance signals (MR1r, MR2r, MR3r, MR4r) occurs. To achieve spatial encoding, phase encoding magnetic gradient pulses (PE1r, PE2r, ... PE8r) and read-gradient pulses (RG1r, RG2r, RG3r, RG4r and RG5r) are applied as shown in graph '$G_{enc}$' of FIG. 2. The read gradient pulses achieve scanning of k-space in the $k_x$-direction. Subsequent phase encoding pulses (PE1r, PE2r, ... PE8r) provide respective shifts in the $k_y$-direction. The temporal shape of the various pulse shapes of the read gradient pulses and phase encoding gradient pulses have the reference temporal pulse shape(s). Notably, the reference temporal pulse shapes have relatively high slew rates, so as to allow a relatively short intrinsic scan time ($T_{R0}$).

FIG. 2 shows a schematic representation of the gradient and RF wave-forms for a typical 4 ETL TSE sequence with a fixed repetition time equal to $T_R$. The total signal scan time is therefore $T_{scan}=N \times T_R$ where N is the number of interleaves required to acquire a complete image matrix. For a 256 encoded image matrix N=64. This signal scan time $T_{scan}$ of the reference pulse sequence is the intrinsic signal scan time for this 4 ETL TSE sequence. Gradient slew rate is set to maximum in this example.

$$SAR \propto \frac{\sum_{T_{scan}} \alpha 1(B1_{max}, t)^2 + \sum_{T_{scan}} \beta 1(B1_{max}, t)^2}{T_{scan}} \quad [1]$$

Typically $\beta 1 = 2 \cdot \alpha 1$ where $\beta 1$ is a 180 degree RF pulse which is a function of pulse shape, duration, t, and peak RF field amplitude equal to some maximum available value $B1_{max}$ μT. In this example the total number of $\alpha 1$ pulses is 64 and the total number of $\beta 1$ pulses is 4×64=256 for the fully encoded scan. For fixed TR, acoustic noise is proportional to gradient amplitude, slew rate and the total number of gradient slopes. Assuming all diagrams are drawn on the same scale, then in FIG. 2, the gradient amplitudes represent initial amplitudes as required by the parameters of the TSE sequence. The gradient rise-time is instantaneous representing maximum slew rate. In general then:

$$\text{Acoustic\_Noise\_Level} \propto G \cdot S \cdot N_{slopes} \quad [2]$$

Where G=gradient amplitude, S=gradient slew rate and $N_{slopes}$=No. of gradient slopes. Reducing either G, S, $N_{slopes}$ or all three simultaneously, can lead to a significant lowering of acoustic noise.

Figure 3:
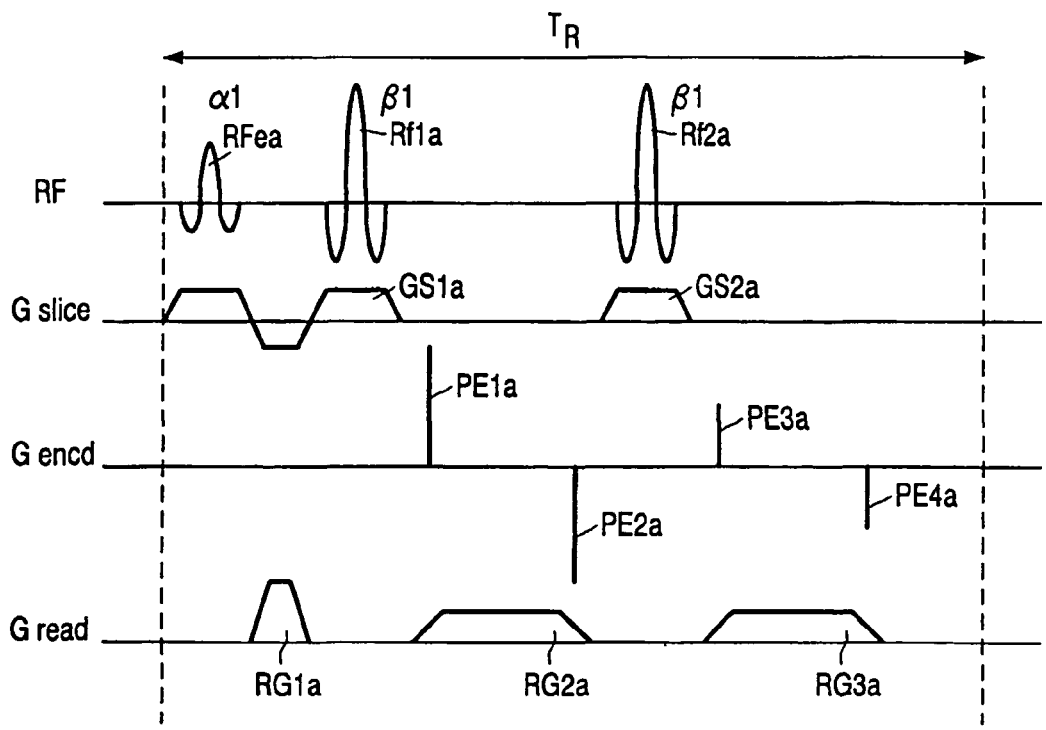

Graph indicated 'Gread' in FIG. 3 shows the pulse shapes of the read gradient pulses in an example of the actual the pulse sequence where undersampling is applied. Graph $G_{slice}$ indicates the slice magnetic selection gradient pulses. Graph $G_{enc}$ indicates the magnetic phase-encoding gradient pulses. Graph RF indicates the RF-pulses, such as radio-frequent excitation and refocusing pulses. The pulse sequence shown in FIG. 3 has less gradient pulses having lower amplitudes and slew rates relative to the pulse sequence shown in FIG. 2 having the intrinsic signal scan time and the reference pulse shapes. The number of RF refocusing pulses (Rf1a, ... Rf2a) which are applied to refocusing the transverse magnetization component is smaller, about half of the number of RF refocusing pulses in the reference TSE pulse sequence shown in FIG. 2. The read gradient pulses (RG1a, RG2a, RG3a) and the magnetic slice selection gradient (Gs1a) in FIG. 3 have a far smaller slew rate relative to the slew rate of the reference pulse shapes shown in FIG. 2. Further, less spin echo magnetic resonance signals (MR1a, MR2a) are generated. Also the phase encoding gradient pulses (PE1a, ... PE4a)) having lower slew rates and amplitudes. The repetition time $T_R$ is the same as for the reference pulse sequence of FIG. 2. Because less, in this example only half, of the number of magnetic resonance signals are acquired the actual signal scan time equals the intrinsic signal scan time ($T_{scan}$).

FIG. 3 is similar to FIG. 2, except the gradient slew rate of both the magnetic read gradient pulses and of the magnetic slice selection gradient pulses is now reduced. This has the effect of reduced acoustic noise in addition to the reduced SAR. Since the gradient slew rate is reduced it is necessary to space the gradient wave-forms further apart. Since the repetition time $T_R$ is fixed and there is spare time available, this is now possible with no penalty on the total signal scan time, which remains the same $T_{scan}$, as in FIG. 2. In this example, SENSE is used to complete the full matrix acquisition. A further advantage of reducing the slew rate is the effect it has in lowering the time derivative of the magnetic (gradient) field dB/dt which can be a cause of peripheral nerve stimulation (PNS) in fast imaging sequences that use strong gradients.

Figure 4:
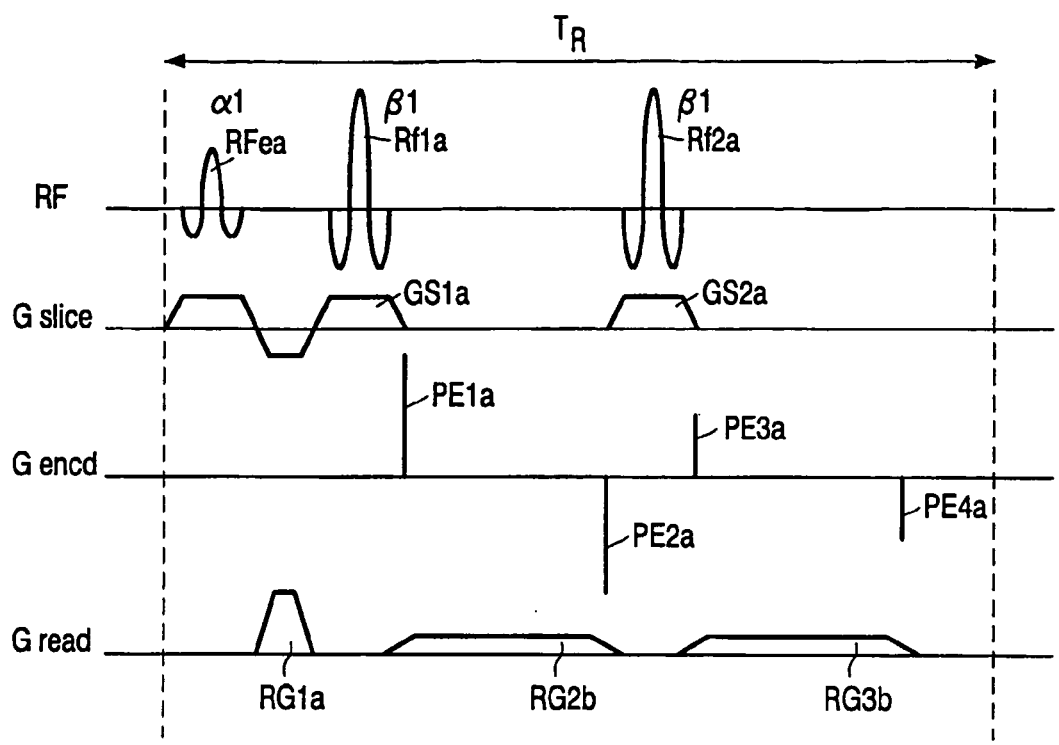

Graph indicated 'Gread' in FIG. 4 shows the pulse shapes of the read gradient pulses in an example of the actual the pulse sequence where undersampling is applied. Graph $G_{slice}$ indicates the slice magnetic selection gradient pulses. Graph $G_{enc}$ indicates the magnetic phase-encoding gradient pulses. Graph RF indicates the RF-pulses, such as radio-frequent excitation and refocusing pulses. The pulse sequence shown in FIG. 4 has less gradient pulses having lower amplitudes and slew rates relative to the pulse sequence shown in FIG. 2 having the intrinsic signal scan time and the reference pulse shapes. The read gradient pulses (RG1a, RG2b, RG3b) and the magnetic slice selection gradient (Gs1a) in FIG. 4 have a far smaller slew rate relative to the slew rate of the reference pulse shapes shown in FIG. 2. Further, the read gradient pulses (RG2b,RG3b) have been decreased in amplitude and lengthened in time. The actual signal scan time ($T_{scan}$) equals the intrinsic signal scan time.

FIG. 4 shows a sequence similar to that of FIG. 3 except the "$G_{read}$" gradient wave-forms have now been decreased in amplitude and lengthened in time. The extra time available in the TR is used to accommodate the resulting increase in echo spacing. The net effect of lowering and lengthening the "G read" wave-forms is threefold.

1. The lowering of gradient amplitude reduces further the acoustic noise.

2. The lowering of gradient amplitude reduces further the possibility of PNS.

3. The lengthening of the "G read" wave-forms is compensated by using a lower acquisition bandwidth which results in a higher SNR in many cases.

The SENSE technique is again utilized to recover the full 256 matrix from the 64×2=128 encoding steps that are actually acquired for reconstruction of the magnetic resonance image.

The SAR is identical to that of FIG. 3 (lower than the scan using the reference sequence), the acoustic noise and PNS potential are even lower than that of FIG. 3 and the SNR is improved due to the lower bandwidth now used to sample each echo. Once again, the total scan time, $T_{scan}$, and image resolution/properties are essentially equal to those of the scan using the reference pulse sequence of FIG. 2.

Figure 5:
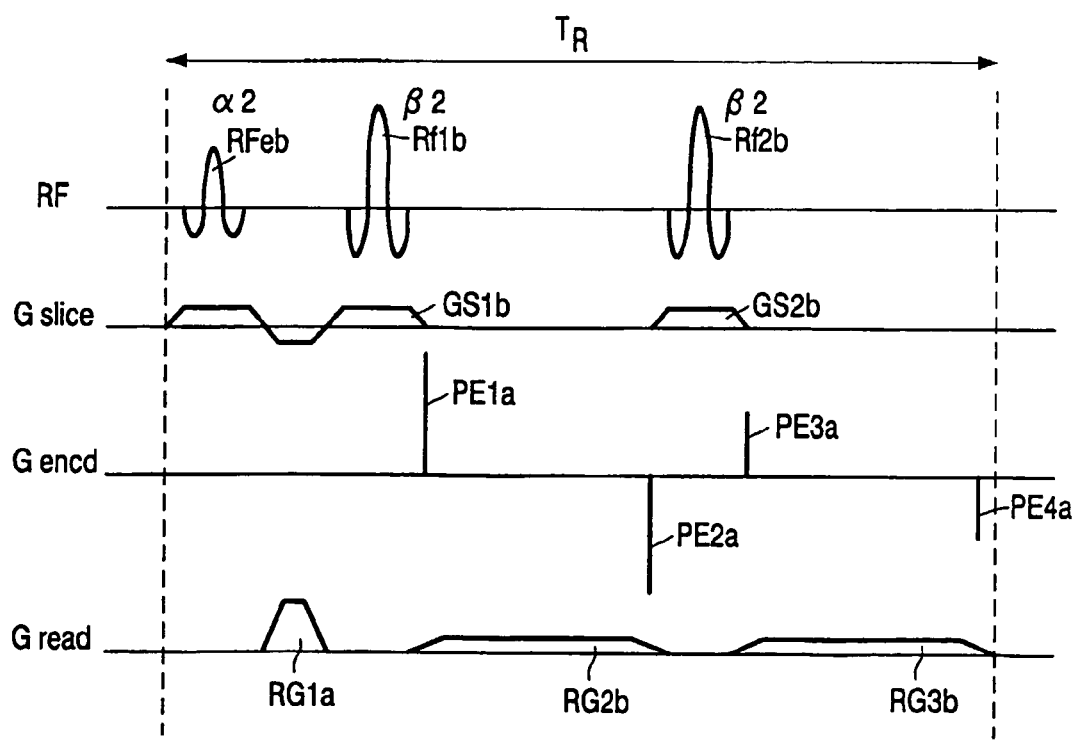

Graph indicated 'Gread' in FIG. 5 shows the pulse shapes of the read gradient pulses in an example of the actual the pulse sequence where undersampling is applied. Graph $G_{slice}$ indicates the slice magnetic selection gradient pulses. Graph $G_{enc}$ indicates the magnetic phase-encoding gradient pulses. Graph RF indicates the RF-pulses, such as radiofrequent excitation and refocusing pulses. The pulse sequence shown in FIG. 5 has less gradient pulses having lower amplitudes and slew rates relative to the pulse sequence shown in FIG. 2 having the intrinsic signal scan time and the reference pulse shapes. The read gradient pulses (RG1a, RG2b, RG3b) and the magnetic slice selection gradient (Gs1b) in FIG. 5 have a far smaller slew rate relative to the slew rate of the reference pulse shapes shown in FIG. 2. Further, the peak RF-fields of the RF-excitation pulse (Rfeb) and of refocusing RF-pulses (Rf1b, RF2b) are lower as compared to the reference pulse sequence. Also, as in the example in FIG. 4, the read gradient pulses (RG2b, RG3b) have been decreased in amplitude and lengthened in time The actual signal scan time is about equal to the intrinsic signal scan time.

FIG. 5 is similar to FIG. 4. In this case, RF pulses that use a lower B1 are employed, (represented by $\alpha_2$ and $\beta_2$).

The use of a lower B1 further reduces the SAR of the sequence. In addition, it requires to also reduce the RF pulse bandwidth which results in longer duration RF pulses. As a result of this reduced bandwidth, the "G slice" gradient is also reduced in amplitude. This reduction in amplitude leads to a further reduction in acoustic noise level and PNS potential.

Since the RF pulses are now longer in duration they are spaced further apart. Utilizing the remaining time that is left within the TR, it is possible to space out the RF pulses further and additionally length and lower the "$G_{read}$" gradient wave-forms. This secondary effect provides both a further reduction in acoustic noise levels and a further increase in SNR.

As in all previous embodiments, the total acquisition time remains the same and the SENSE method is utilizing to generate the data for the full 256 matrix.

The PNS potential of this implementation is yet lower than previous examples.

The invention claimed is:

1. A magnetic resonance imaging method comprising
    application of a pulse sequence which includes one or more pulses
    the pulse sequence having an intrinsic scan time based on a full sampling rate in k-space for a predetermined full 'field-of-view' and a reference temporal pulse shape of the magnetic gradient pulses
    acquisition of a series of magnetic resonance signals by means of a receiver antennae system having a spatial sensitivity profile, wherein
    undersampled signal acquisition is applied to acquire undersampled magnetic resonance signals at a predetermined reduced sampling rate in k-space, the sampling rate being reduced by a reduction factor relative the full sampling rate
    the pulse sequence being applied during an actual signal scan time, the actual signal scan time being larger than the intrinsic signal scan time times the reduction factor,
    wherein the pulse sequence includes magnetic gradient pulses and the magnetic gradient pulses are applied with a slew rate that is less than the slew rate involved with the reference pulse shape.

2. A magnetic resonance imaging method as claimed in claim 1, wherein the actual signal scan time is substantially equal to the intrinsic signal scan time.

3. A magnetic resonance imaging method as claimed in claim 1, wherein the pulses are applied with a pulse shape having temporal variations that are more slowly than the temporal variations involved in the reference temporal pulse shape.

4. A magnetic resonance imaging method as claimed in claim 1, wherein the pulse sequence includes radiofrequent (RF) pulses and the radiofrequent (RF) pulses are applied with an RF-magnetic field component ($B_1$) that is less than the RF-magnetic field component ($B_1$) involved with the reference pulse shape.

5. A magnetic resonance imaging method as claimed in claim 1, wherein the pulse shape of the pulses is adjustable so as to adapt the actual signal scan time of the pulse sequence in the range between the intrinsic signal scan time times the reduction factor and the intrinsic signal scan time.

* * * * *